(12) United States Patent
Kamp et al.

(10) Patent No.: US 7,492,187 B2
(45) Date of Patent: Feb. 17, 2009

(54) CIRCUIT ARRANGEMENT FOR SUPPLYING CONFIGURATION DATA IN FPGA DEVICES

(75) Inventors: Winfried Kamp, München (DE); Siegmar Koeppe, München (DE); Michael Scheppler, Gröbenzell (DE)

(73) Assignee: Infineon Technologies AG, Munich (DE)

(*) Notice: Subject to any disclaimer, the term of this patent is extended or adjusted under 35 U.S.C. 154(b) by 97 days.

(21) Appl. No.: 11/437,421

(22) Filed: May 19, 2006

(65) Prior Publication Data

US 2006/0273823 A1 Dec. 7, 2006

(30) Foreign Application Priority Data

May 19, 2005 (DE) .................. 10 2005 023 118

(51) Int. Cl.
*H03K 19/177* (2006.01)
(52) U.S. Cl. ........................................ 326/40; 326/41
(58) Field of Classification Search ............. 326/37–41, 326/47
See application file for complete search history.

(56) References Cited

U.S. PATENT DOCUMENTS

| | | | | |
|---|---|---|---|---|
| 5,760,719 A | * | 6/1998 | Graf | ........................... 341/100 |
| 5,883,526 A | * | 3/1999 | Reddy et al. | ................... 326/41 |
| 6,324,102 B1 | | 11/2001 | McCollum | |
| 6,356,478 B1 | | 3/2002 | McCollum | |
| 6,481,000 B1 | * | 11/2002 | Zaveri et al. | ................... 716/17 |
| 2004/0068330 A1 | | 4/2004 | White | |

FOREIGN PATENT DOCUMENTS

| | | |
|---|---|---|
| EP | 0 317 287 B1 | 11/1992 |
| EP | 1 324 495 A1 | 6/2003 |
| JP | 04006913 A | 1/1992 |

* cited by examiner

*Primary Examiner*—James H Cho
(74) *Attorney, Agent, or Firm*—Maginot, Moore & Beck (57) ABSTRACT

A circuit arrangement for supplying configuration data in an FPGA device includes a plurality of output flip flops allocated to respective configurable logic cells of the FGPGA device. Each output flip flop comprises at least one data input and one data output and a data input of a first output flip flop of the plurality of output flip flops is switchably connected to a data output of a second output flip flop of the plurality of output flip flops for forming a shift register by means of a switching device integrated in the FPGA device.

23 Claims, 9 Drawing Sheets

CIRCUIT ARRANGEMENT FOR SUPPLYING CONFIGURATION DATA IN FPGA DEVICES

BACKGROUND OF THE INVENTION

The invention relates to a circuit arrangement for supplying configuration data in FPGA devices.

FPGAs (field programmable gate arrays) are integrated electronic circuits which are completely programmable by the user ("in the field") and perform a multiplicity of logic functions desired by the user in accordance with their programming or their configuration, respectively. As a rule, configurable logic blocks and configurable wiring resources are provided for this purpose in an FPGA, the electrical interconnections of these with one another being determined by a multiplicity of switches which can be set by configuration bits. The logic functions of the configurable logic blocks, which, in turn, are configured of configurable logic cells, are also specified by configuration bits. The configuration or programming of an FPGA is thus performed by the writing-in and (volatile) storing of corresponding configuration data in memories kept available in the logic blocks. Thus, a complex logic chip is formed overall.

A number of logic cells and their associated wiring resources, that is to say prefabricated electrical connecting elements definable by the configuration bits, are combined as a configurable logic block or as a logic page. A corresponding logic page also exhibits a local configuration memory in which the required configuration bits are stored. In the text which follows, individual logic cells with configuration shift registers are mentioned in a simplified manner as local configuration memories.

Before an FPGA starts to operate, all configuration bits must be written into the local configuration memories from the outside. This must be done after each new start-up after the voltage supply has been switched off. However, it is frequently desired to keep the configuration data available in a nonvolatile manner in a memory integrated in the corresponding FPGA chip. In this case, the configuration data only need to be transported from the nonvolatile memory into the local configuration memory.

A so-called nonvolatile FPGA chip therefore has as basic elements the configurable logic cells mentioned initially and additionally a nonvolatile memory for storing configuration data. In this configuration memory, for example, the corresponding configuration bits are stored in suitably structured form "in the field" and when the FPGA is started up, they are first supplied as configuration bits to the settable switches present in the configurable cells. A respective configurable logic cell therefore has a configuration register which stores a respective configuration word of configuration bits in a volatile manner for the operation of the FPGA and individually provides the configuration bits which lastly determine the logic function of the configurable logic cell.

The configurable logic cells and the local configuration memory are typically implemented in the same production technology, for example CMOS, whereas the non-volatile configuration memory needs another technology, e.g. FLASH. For the circuit sections constructed in different technologies, different signal levels are then used. Matching the corresponding logic levels then increases the circuit expenditure.

A special feature in nonvolatile configuration memories is the verification of the configuration data written in. This can be done by reading out the information written in and comparing with the written data. This verification method can disadvantageously require a number of cycles.

Figure 1:
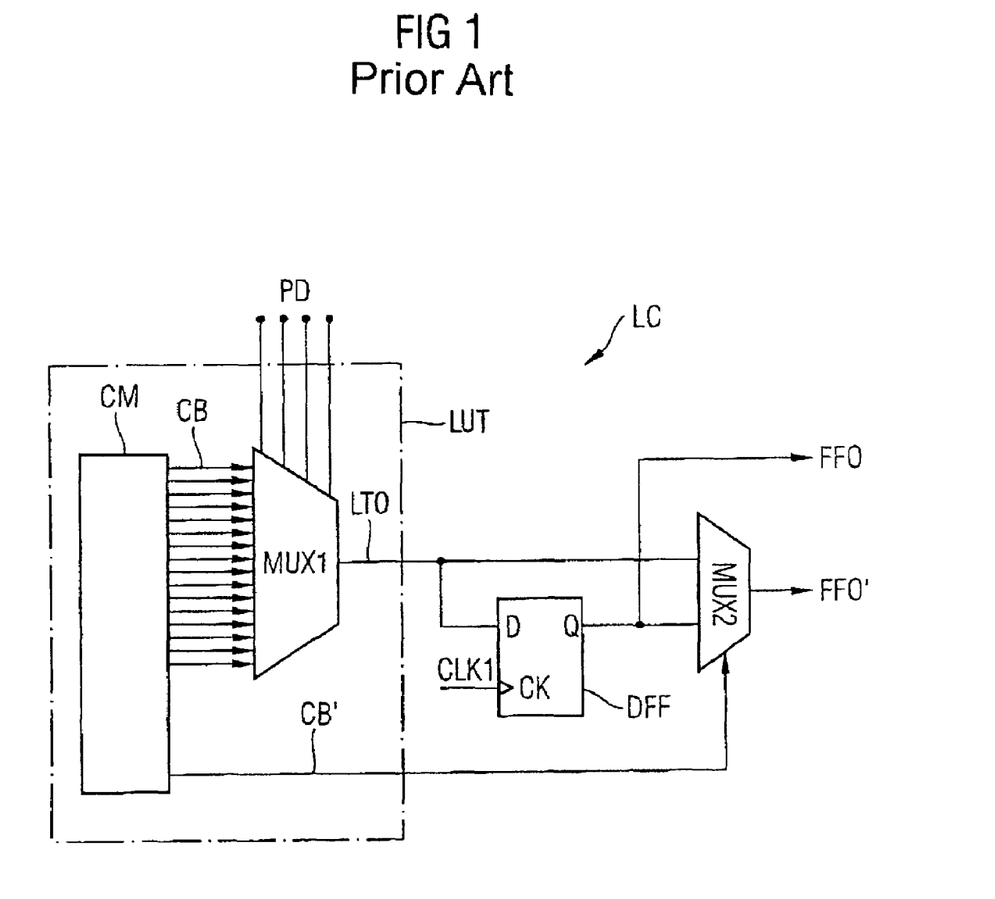
FIG. 1, as discussed above, is a conventional configurable logic cell.

FIG. 1 shows by way of example the structure of a configurable logic cell LC for conventional FPGAs as disclosed, for example, in published European application for patent EP 1 324 495 A1.

A correspondingly configurable logic cell LC is used for converting a logic function which receives the input data PD and outputs a corresponding logically combined result FFO. A configuration shift register CM is provided which stores configuration bits CB and provides them to the input of a first multiplexer MUX1. The first multiplexer MUX1 defines one of the configuration bits CB as output signal LTO in dependence on the input data PD. The multiplexer MUX1 with the configuration bits CB supplied by the configuration shift register CM can be understood to be a look up table LUT. It is possible, therefore, to perform a Boolean function with the input data PD as input variables and the output signals LTO of the multiplexer or the look up table LUT, respectively.

Furthermore, a D-type flip flop DFF with a data input D, a data output Q and a clock input CK is provided. The output signal LTO of the look up table is conducted to the data input D and a clock signal CLK1 is applied to the clock input CK. The output signal LTO of the look up table LUT is also conducted to an input of a second multiplexer MUX2 which also receives the output signal FFO of the D-type flip flop DFF. The second multiplexer MUX2 switches through either the output signal FFO of the flip flop DFF or the output signal LTO of the look up table LUT as output signal FFO' of the configurable logic cell LC in dependence on one of the configuration bits CB'. If FPGA chips are used for applications in data processing, the clocked output signals FFO of the D-type flip flop DFF which, as a rule, is provided in a configurable logic cell LC for an FPGA chip, and in most cases used. The D-type flip flop DFF is then used for temporarily storing the output signal of the logic cell LC.

Figure 2:
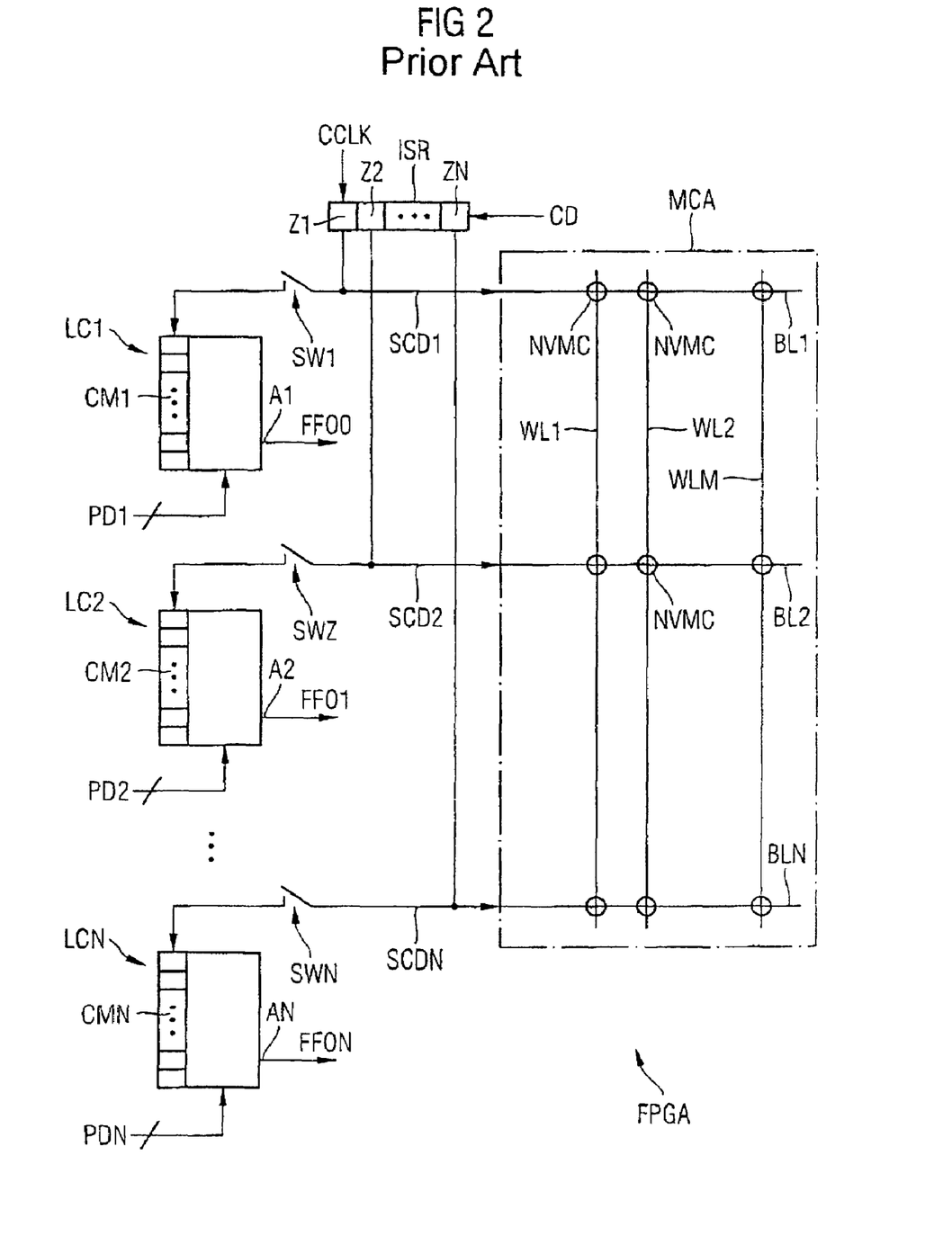
FIG. 2, as discussed above, is a diagrammatic representation of a conventional a nonvolatile FPGA.

In FIG. 2 the basic elements of a conventional nonvolatile FPGA chip FPGA are shown diagrammatically.

The FPGA has configurable logic cells LC1, LC2, LCN in a column, wherein each configurable logic cell supplies a respective logic result FF0, FF1, FFN from the respect input signals PD1, PD2, PD3 to an output A1, A2, AN. The configurable logic cells LC1, LC2, LCN in each case have configuration shift registers CM1, CM2, CMN for storing and providing configuration bits for the respective logic cell LC1, LC2, LCN.

Before the FPGA starts up, in a configuration phase, the respective configuration bits are read out of a nonvolatile memory MCA as serial configuration data SCD1, SCD2, SCDN into the configuration shift registers CM1, CM2, CMN. The configuration memory MCA can have, for example, a memory cell array of nonvolatile memory elements such as, for example, MRAM or FRAM memory cells. The actual programming of the FPGA takes place in a read-in phase in which the configuration data are written into the memory cell array MCA. For this purpose, a further loading shift register ISR is provided, with a number N of shift register cells Z1, Z2, ZN which corresponds to the number of the bit lines BL1, . . . BLN coupled to the memory cell array MCA of nonvolatile memory elements.

The configuration data CD are read serially into this loading shift register ISR clock cycle by clock cycle with a clock CLK. Each of these shift register cells Z1, Z2, ZN is coupled to a bit line BL1, BL2, BLN. The respective bit lines BL1, BL2, BLN of the memory cell array MCA are crossed with word lines WL1, WL2, WLN, the number of word lines corresponding to the number of respective configuration bits for a configurable logic cell LC1. In the writing-in phase of the configuration data CD, all first configuration bits for the configurable logic cells LC1, LC2, LCN are first serially written into the nonvolatile memory cells NVMC. In a further step, second configuration bits are written until all configuration data CD are conducted into the memory cell array MCA. It is only then that the configuration shift registers CM1, CM2, CMN, with closed controllable switches SW1, SW2, SWN, are filled with the configuration bits stored in the nonvolatile memory cells NVMC of a respective bit line BL1, BL2, BLN in the configuration phase of the FPGA.

With an embodiment of the nonvolatile memory cells NVMC as FRAM cells, in particular, additional elaborate converter circuits, which are not shown here, are required for reading and writing the memory cell contents. A disadvantage of the solution in shown in FIG. 2 for writing configuration data CD into the nonvolatile memory MCA via a shift register ISR is also the additional wiring expenditure due to the coupling of the individual shift register cells Z1, Z2, ZN of the loading shift register ISR to the bit lines BL1, BL2, BLN and the increased circuit expenditure due to the shift register ISR itself.

BRIEF SUMMARY OF THE INVENTION

At least some disadvantages associated with the prior art are addressed by one or more embodiments of the invention.

A first embodiment of the invention is a circuit arrangement having a plurality of output flip flops. The plurality of output flip flops is configured to provide configuration data to configurable logic cells of a FPGA device, each output flip flop comprising at least one data input and one data output. A data input of a first output flip flop of the plurality of output flip flops is switchably connected to a data output of a second output flip flop of the plurality of output flip flops for forming a shift register using at least a switching device integrated in the FPGA device.

The above described features and advantages, as well as others, will become more readily apparent to those of ordinary skill in the art by reference to the following detailed description and accompanying drawings.

DETAILED DESCRIPTION OF THE INVENTION

According to at least some embodiments of the invention, a circuit arrangement for operating output flip flops, provided in configurable logic cells of an FPGA device, for transporting configuration data is specified, the circuit arrangement comprising a number of output flip flops which are associated with respective configurable logic cells, each output flip flop exhibiting at least one data input and one data output. According to the invention, a data input of a first output flip flop is switchably connected to a data output of a second output flip flop for forming a shift register by means of a switching means integrated in the FPGA device.

One aspect of some embodiments of the invention is switching the output flip flops in the configurable logic cells together as shift registers during the phase of writing configuration data into a nonvolatile memory. For this purpose, according to these embodiments, switching means are integrated in the FPGA device. During the normal operating phase of the corresponding FPGA device, the output flip flops are used for the clocked output of output data processed by the respective logic cell. The circuit arrangement according to these embodiments thus makes it possible to dispense with additional shift registers for transporting configuration data into nonvolatile configuration memories and reduces the wiring expenditure. At least an alternative switching of the respective output flip flops as shift register chain is, therefore, according to these embodiments, wherein respective data outputs are connected to data inputs of other output flip flops or as output elements of the logic cells for outputting the data processed in accordance with the configuration of the logic cell. Due to the circuit arrangement according to these embodiments, a switchability of the inputs and outputs of the output flip flops, to be achieved in a simple manner, is achieved and a considerable wiring and circuit expenditure is saved by special loading devices for writing the configuration data into nonvolatile configuration memories.

The data output of a respective output flip flop may be followed by a means for signal level conversion. By these means, differences in the logic levels due to different production technologies of the configurable logic cells and other circuit sections of the FPGA, particularly of configuration memories, can be compensated for. This is of advantage, in particular, if the FPGA device exhibits an integrated nonvolatile memory for storing the configuration bits. Corresponding signal level converters then supply from levels present at the outputs of the output flip flops correspondingly adapted levels for the connected nonvolatile configuration memory.

Advantageously, an output signal of a look up table of the respective logic cell may be supplied to the input of a respective output flip flop in a configurable logic cell. As a result, the correspondingly configured Boolean function for the logic cell is supplied to the output flip flop for temporary storage in normal operation as logic cell.

In one embodiment of the circuit arrangement according to the invention, the data input of a respective first output flip flop is preceded by a first multiplexer, which is controllable by means of a first selection signal, for switching the output signal of the respective look up table or the output signal of the second output flip flop. Using a multiplexer provides a simple possibility for switchably connecting the data input of a first output flip flop to a data output of a second output flip flop for forming the shift register.

Advantageously, at least one output flip flop may comprise a clock input, wherein a read-in clock signal or a logic cell clock signal is supplied switchably to the clock input. In this interconnection, it is possible to use various clock cycles during the reading-in of a number of configuration data into the shift register chain constructed according to embodiments of the invention from the output flip flops and the normal operation of the respective logic cells in which the output flip flops then supply logic output signals clocked with the logic cell clock signal.

In some embodiments of the inventive circuit arrangement provides that a second multiplexer, which is controllable by means of a second selection signal, for switching the read-in clock signal or the respective logic cell clock signal precedes the clock input of a respective output flip flop. The first and the second selection signal are then identical in a particularly advantageous manner. In this case, a single selection signal line is sufficient for controlling the two multiplexers.

The output flip flops may be constructed as clock-edge-controlled D-type flip flops.

In a further embodiment of the inventive circuit arrangement, the data output of a respective output flip flop is connected to a read-in/-out amplifier for a bit line of a memory cell array. The read-in/-out amplifier is used for writing bits into memory cells coupled to the respective bit line and for reading out the respective stored bit states in the memory cells. It is, therefore, of particular advantage that the respective bit line is coupled to a predetermined number of memory cells for storing configuration bits, the memory cells being arranged at points of intersection of corresponding word lines with the bit lines.

Such a matrix-shaped arrangement of the memory cells for the configuration bits can be of advantage, for example for FRAM memory cells. The read-in/-out amplifier is then also used for signal matching, on the one hand, when the configuration data are written into the memory cell array and, on the other hand, during the reading-out of the configuration bits which are stored in memory cells at a bit line, and to corresponding configuration registers of the associated configurable logic cell.

The number of word lines may correspond to the number M of the configuration bits for a configurable logic cell. All configuration bits or a corresponding configuration word for a logic cell are thus stored in memory cells which are coupled to the bit line which, in turn, is connected to the output flip flop via a read-in/-out amplifier. This particularly advantageous interconnection according to this embodiment also provides for the verification of configuration data written into the memory cell array in addition to the data transport via the shift register chain formed for writing data into the memory cell array.

The read-in/-out amplifiers advantageously in each case may comprise a read-in input for reading data which are to be written into the memory cells coupled to the respective bit line and a read-out output for outputting configuration data to the respective configurable logic cell. It is particularly advantageous that the respective first multiplexer then may comprise a third input to which the respective read-out output of the read-in/-out amplifier is connected for switching configuration bits of the configuration data to the data input of the respective output flip flop. Due to this interconnection, it is possible to temporarily store the memory cell contents of the configuration memory in the output flip flop in a special operating mode. This can be used, for example, for the verification of the configuration data written into the memory.

A respective read-out output of the read-in/-out amplifier may be switchably connected to a configuration shift register of the respective configurable logic cell in order to create a transfer of the configuration bits.

In a further embodiment of the inventive circuit arrangement, a respective read-in/-out amplifier may comprise a logic device for comparing a data item present at the read-in input and the read-out output and for outputting a comparison result. In combination with a temporarily stored data item in the respective output flip flop, a comparison of data stored in the memory cells and the temporarily stored data item is thus possible.

An FPGA device may be provided which comprises a multiplicity of configurable logic cells, comprises a multiplicity of circuit arrangements according to at least some embodiments of the invention and comprises a memory cell array. The configurable logic cells are arranged in columns and a shift register can be formed by means of the output flip flops of the respective columns.

The column arrangement of the logic cells may provide for a particularly advantageous wiring construction and formation of the shift register according to the invention for transporting configuration data. The memory cells arranged in the form of a matrix at points of intersection of word and bit lines of the memory cell array can be read in and out simply by means of the read-in/-out amplifiers. This can be produced with advantageous expenditure by means of the FPGA device because no additional means for writing the configuration data into the memory cell array need to be provided.

Advantageously, the levels present at a data output of a respective output flip flop may be compared with the corresponding level at the associated read-out output for generating a result of the comparison. The comparison results of the read-in/-out amplifiers of a column are then logically combined with one another for generating by this means a column error signal. Thus, for example, the respective result of the comparison can be combined with a further one in a cascaded manner and it can be determined whether different logic states are present at one of the read-in/-out amplifiers of a column. A control device for generating the selection signals may suitably be provided. The control device can coordinate, for example, the application of the various clock signals to the clock inputs of the output flip flops and corresponding signals to the data inputs.

In another embodiment, a supply voltage for the first and second multiplexer may be separately switched. Since the multiplexers are mainly used during the writing of the configuration data into the memory cell array or during a verification operating mode for comparing the reference data written into the memory cell array, these can be switched off in a current-saving manner whilst the FPGA chip is operating in normal mode. In normal mode, the configurable logic cells operate as logic functions in accordance with their configuration due to the configuration bits in their configuration shift registers.

In an alternative embodiment of the FPGA device according to the invention, each memory cell coupled to a respective bit line may be coupled to a switching transistor of the respective configurable logic cell. In this arrangement, the switching transistors define a logic function of the configurable logic cell.

The above described embodiments will become more readily apparent by reference to the embodiments illustrated in the drawings.

Unless otherwise specified, identical or functionally identical elements have been provided with the same reference symbols in the figures.

Figure 3:
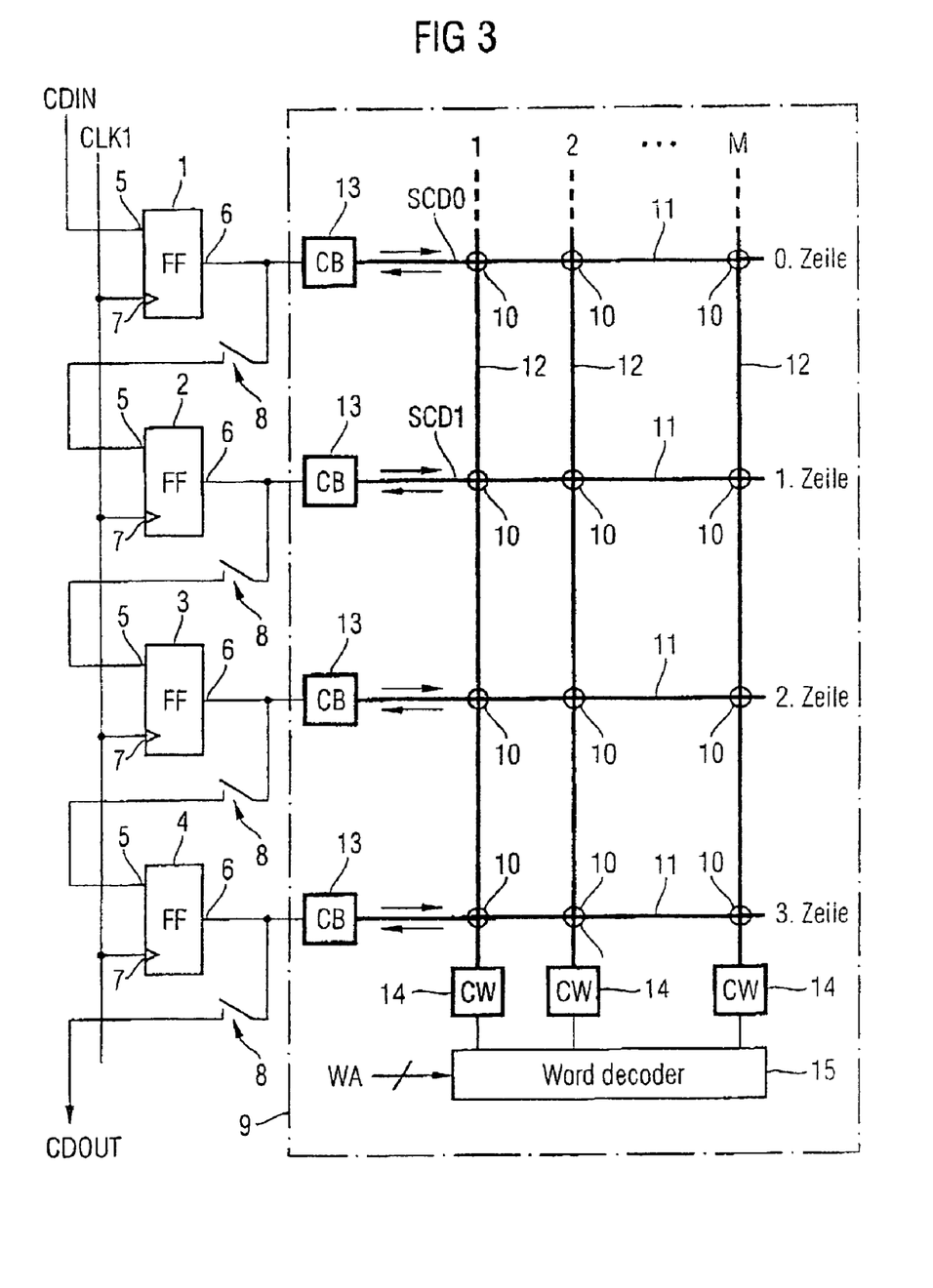
FIG. 3 is a diagrammatic representation of a first embodiment of an inventive circuit arrangement.

FIG. 3 shows a first embodiment of the interconnection according to the invention with output flip flops, coupled to a nonvolatile memory, of associated configurable logic cells. A number of flip flops 1, 2, 3, 4 arranged in a column are represented which in each case have a data input 5, a data output 6 and a clock input 7. The flip flops 1, 2, 3, 4 shown are in each case part of a programmable logic cell which is not shown in greater detail here. In an operation according to the prior art as is shown, for example, in FIG. 1, the flip flops 1, 2, 3, 4 are used as output flip flops for outputting output signals of a look up table of the respective logic cell, also provided.

According to the invention, the data input 5 of a first flip flop 2 is in each case switchably connected to a data output 6 of a second output flip flop 1 via a switch 8. The clock inputs 7 of the output flip flops 1, 2, 3, 4 are supplied with a common clock signal CLK. Furthermore, a memory cell array 9 is provided which is used as memory for configuration data for the configurable logic cells. The corresponding nonvolatile memory cells 10 are in each case provided at points of intersection of a bit line 11 with a word line 12.

In the example shown here, four bit lines 11 are shown which are in each case coupled to the data outputs 6 of the output flip flops 1, 2, 3, 4 via a read-in/-out amplifier 13. Among other things, the read-in/-out amplifiers 13 are used as signal level converters since the memory cell array or the configuration memory integrated into the FPGA, and the remaining elements determining the logic functions can be produced in various production technologies. It is then possible to match the respective logic levels between the technologies by means of the read-in/-out amplifiers 13.

The word lines 12 are in each case coupled to a word line decoder 15 via read-in/-out amplifiers 14. The word line decoder 15 is supplied with word line address signals WA which address the respective memory cells 10 during the reading-in and -out from the configuration memory 9.

The number of nonvolatile memory cells 10 which are coupled to a bit line 11 corresponds to the number of configuration bits for a configurable logic cell which is associated with the respective output flip flop 1.

The invention then provides the possibility of connecting together the output flip flops 1 to form a shift register. In this arrangement, the data output 6 of the output flip flop 1 associated with row zero or bit line 11 is then connected to the data input 5 of the output flip flop 2 associated with the first row. The data output 6 of the output flip flop 2 associated with the first row is connected to the data input 5 of the output flip flop 3 associated with the second row and the data output 6 of this flip flop 3 is connected to the data input 5 of the output flip flop 4 associated with the third row. Thus, a serial transport of configuration data CDIN to the shift register chain thus formed is possible.

Once the output flip flops 1, 2, 3, 4 have been filled with configuration bits, these bits can be written into corresponding nonvolatile memory cells 10 by the read-in/-out amplifiers 13, 14 in dependence on the word address signals CA. This process is then repeated M-times in order to write the complete configuration data into the memory cell array 9.

Figure 6:
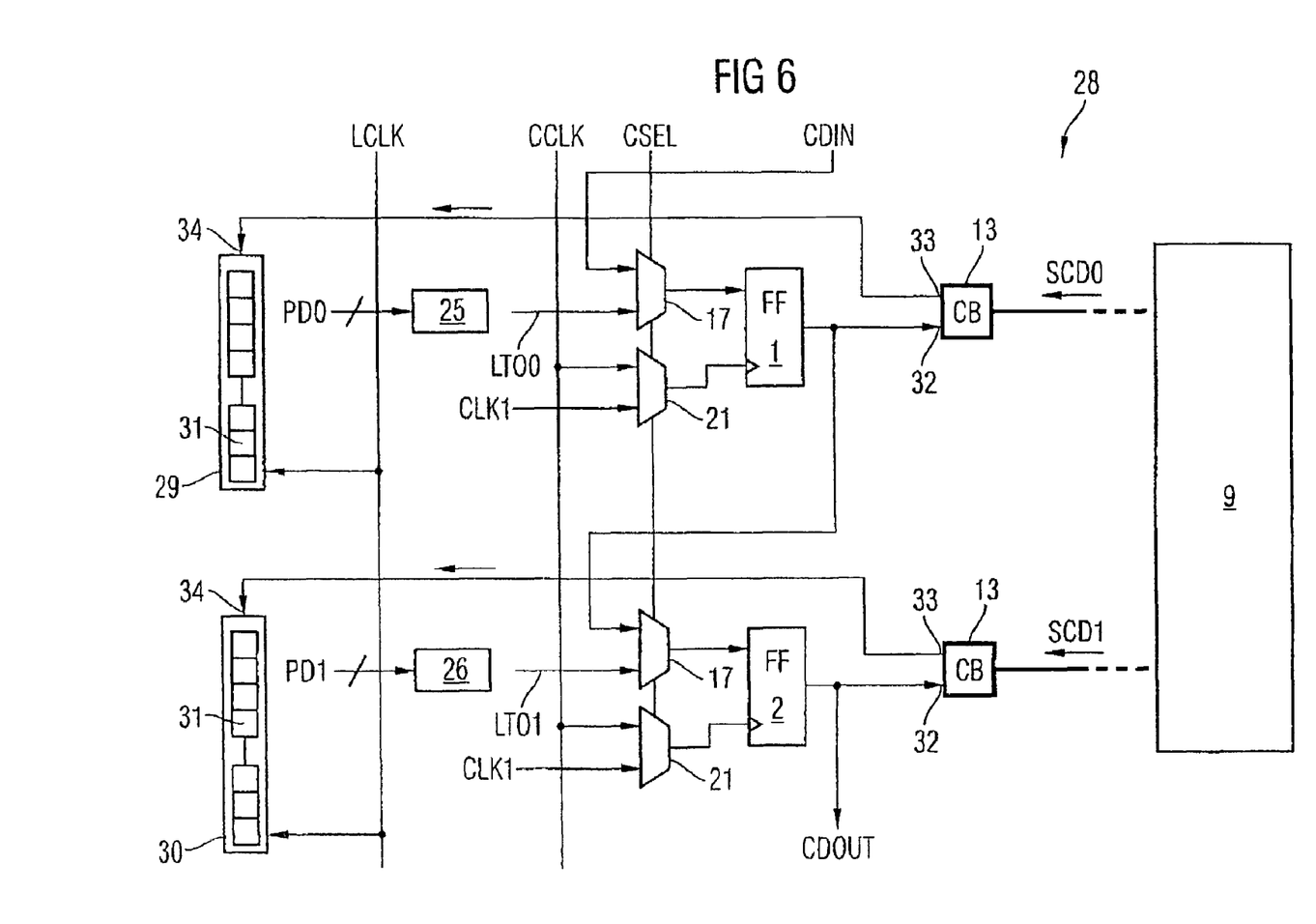
FIG. 6 is the second embodiment of an inventive circuit arrangement.

In a subsequent configuration phase as will be explained in greater detail in the text which follows, for example in FIG. 6, the configuration bits which are stored in nonvolatile memory cells 10 of the same bit line 11 or of the same row, respectively, are read into configuration shift registers (not shown here) of the configurable logic cells.

In the normal operating mode of the corresponding FPGA chips, the switches 8 suitably constructed as controllable switches are then opened so that the output flip flops 1, 2, 3, 4 are only used for the (clocked) output of the respective digital output signals of the look up table associated with the respective configurable logic cell.

Figure 4:
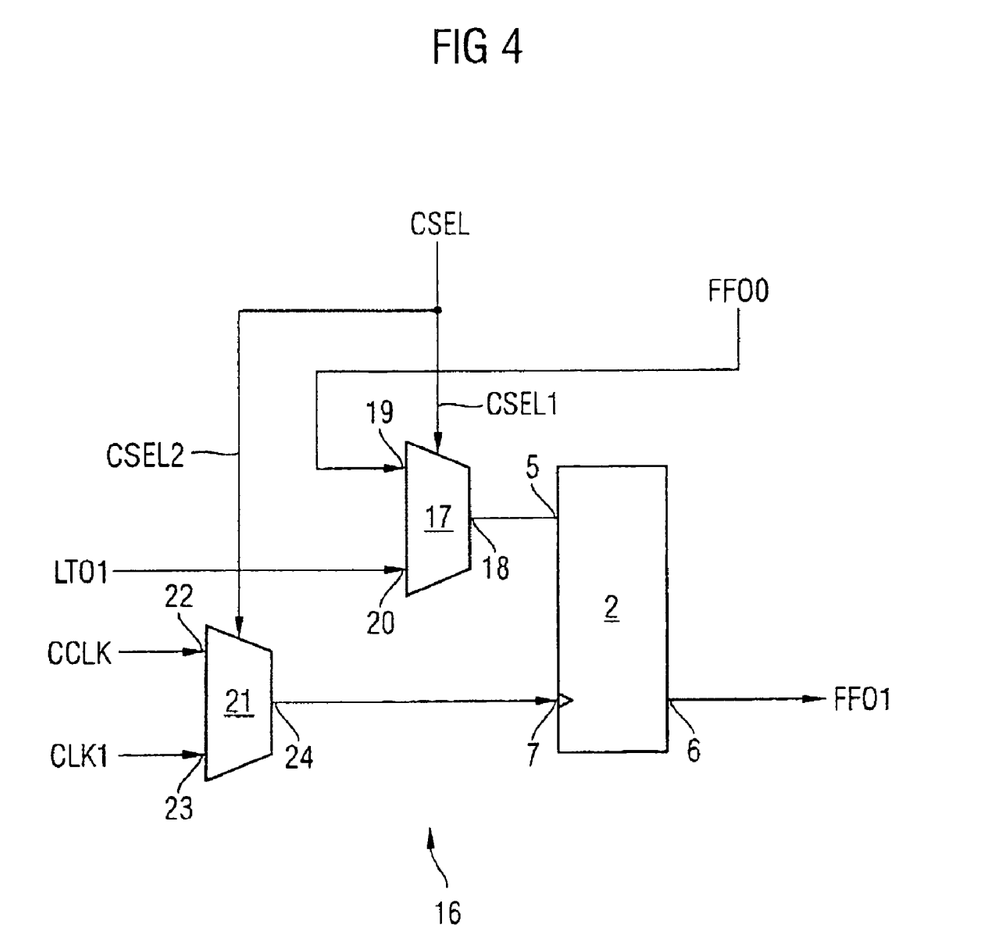
FIG. 4 is a block diagram of an inventive circuit arrangement.

FIG. 4 shows an exemplary embodiment of the circuit arrangement 16 according to the invention around an output flip flop by means of an output flip flop 2 of a respective configurable logic cell. The output flip flop 2 has a data input 5, a data output 6 and a clock input 7.

The data input 5 is preceded by a first multiplexer 17, the output 18 of which is connected to the data input 6. The first multiplexer 17 switches, in dependence on the selection signal CSEL1, either a signal FFO0 supplied to its first input 19 which is the output signal of a second output flip flop (not shown here), or an output signal LTO1 of a look up table of the corresponding logic cell (not shown here) which is conducted to the second input 20 of the first multiplexer 17. By means of the first multiplexer 17, a switch-over between an operating mode, in which a shift register chain is formed by supplying the output signals FFO0 of another output flip flop (read mode), or a normal operating mode in which the output signal LTO1 of the associated look up table is supplied as input signal to the output flip flop 2, is possible in dependence on the selection signal CSEL1.

A second multiplexer 21 is provided with a first input 22 which is supplied with a read clock signal CCLK, and a second input 23 which is supplied with a logic cell clock signal CLK1. The output 24 of the second multiplexer 21 is connected to the clock input 7 of the output flip flop 2. The second multiplexer 21 switches either the read clock signal CCLK or the logic cell clock signal CLK1 to the clock input 7 of the output flip flop 2 in dependence on a second selection signal CSEL2. Thus, two different clock operations are possible depending on operating mode.

For example, the read clock signal CCLK can be used as clock signal for the bit-by-bit transportation through the shift register chain in the interconnection according to the invention of the output flip flop 2 in which the output signal FFO0 is supplied to the input 5. In normal operation, in contrast, it is possible to clock the output flip flop 2 of each configurable logic cell by means of the individual logic cell clock signal CLK1.

Figure 5:
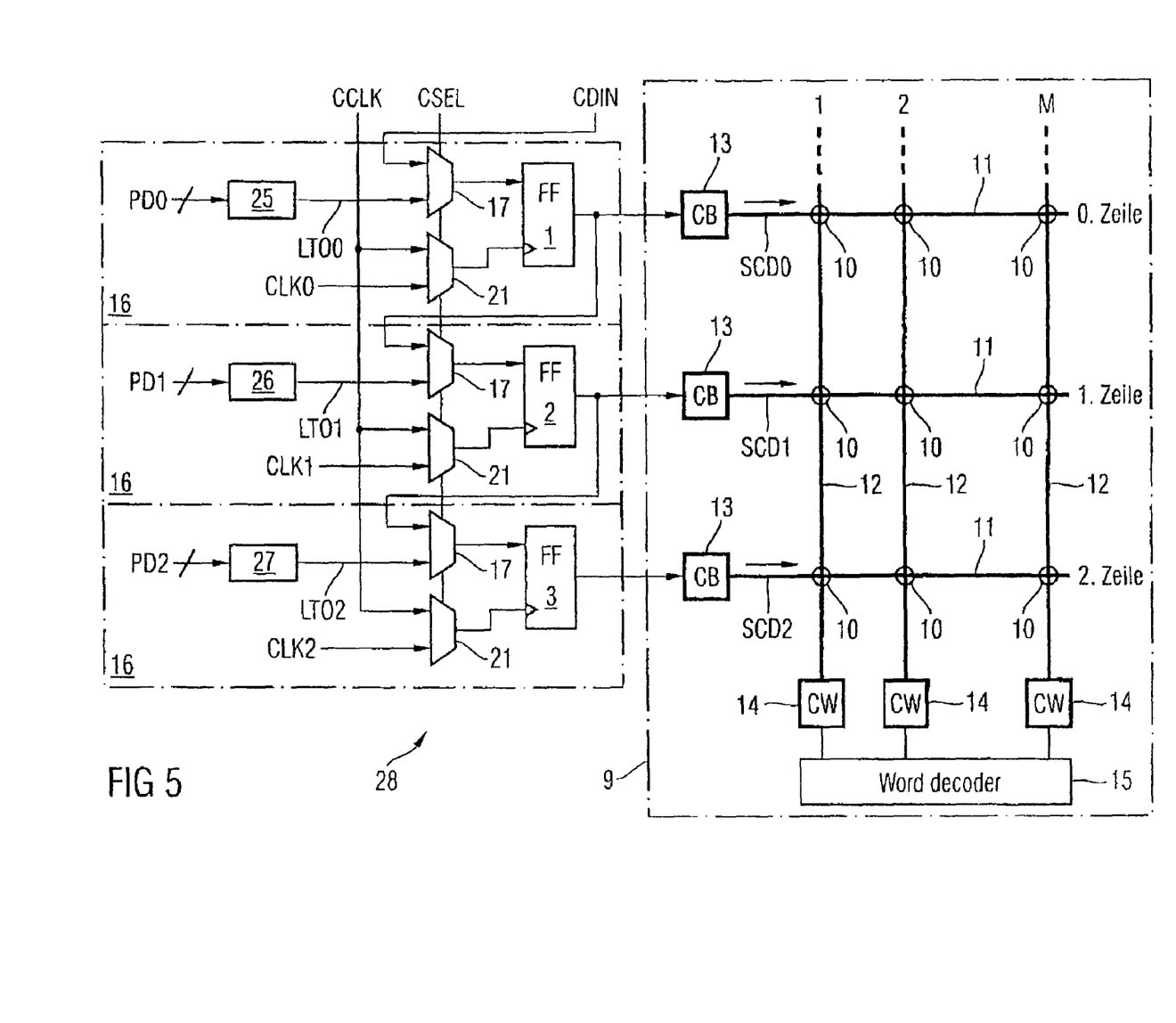
FIG. 5 is a diagrammatic representation of a second embodiment of an inventive circuit arrangement.

FIG. 5 diagrammatically shows use the use of the circuit 16 according to the invention in an FPGA chip. The diagrammatic representation of an FPGA device 28 shows by way of example three circuit arrangements 16 as are shown in FIG. 4, and a memory cell array 9 according to FIG. 3.

The output signals LTO0, LTO1, LTO2 of the look up tables 25, 26, 27 are conducted to the first multiplexer 17. Furthermore, the serial configuration data DCIN are conducted to the first multiplexer 17 of row zero. The data output of the output flip flop 1 of row zero is connected to the first multiplexer 17 of the first row and the signals of the output flip flop 2 of the first row are conducted to the first multiplexer 17 of the second row. Furthermore, the second multiplexers 21 are in each case supplied with the read clock signal CCLK and in each case one logic cell clock signal CLK0, CLK1, CLK2.

In the phase of reading the configuration data into the memory cell array, therefore, the output flip flops 1, 2, 3 are interconnected to form a shift register chain, the output flip flops 1, 2, 3 acting as shift register cells in each case jointly being clocked with the read clock CCLK. The multiplexers 17, 21 are controlled by a common selection signal CSEL. After three clock cycles, the three-element shift register 1, 2, 3 shown here by way of example is filled and in each row nonvolatile memory cells 10 are loaded via the read-in/-out amplifiers 13, 14 and the word line decoders 15. This process is repeated until configuration bits are stored for each configurable logic cell M in the memory cell array 9. The corresponding FPGA chip 28 thus contains the configuration data necessary for its operation. This read-in phase is followed by the configuration phase of the individual configurable logic cells in which configuration shift registers are filled with the configuration bits.

FIG. 6 again shows a section of the FPGA device 28 according to the invention. FIG. 6 also shows the configuration shift register 29 for the configurable logic cell which has the first output flip flop 1, and the corresponding configuration shift register 30 for the configurable logic cell with which the second output flip flop 2 is associated. The configuration shift registers 29, 30 in each case have M shift register cells 31 for storing the configuration bits. After the read-in phase explained with respect to FIG. 5 has been concluded, i.e. the serial configuration data CDIN have been read into the shift register chain formed from the output flip flops 1, 2 by means of the selection signal CSEL and stored in the memory cell array 9, the configuration phase begins for the configurable logic cells.

In the configuration phase, the configuration data stored in the memory cell array 9 are written into the configuration shift registers 29, 30. For this purpose, the configuration shift registers 29, 30 are supplied with a configuration clock signal LCLK and the read-in/-out amplifiers 13 coupled to the respective bit lines have a read-in input 32 and a read-out output 33. The read-in input 32 is connected to the respective data output of the respective output flip flop 1, 2 and the respective read-out output 33 is directly connected to an input 34 of the configuration shift register 29, 30.

In the configuration phase, the configuration bits stored in the memory cells 10 which are coupled to a respective bit line 11 are written as serial cell configuration data SCD0, SCD1, clocked by the configuration clock signal LCLK, into the configuration shift registers 29.

The logic operations of the respective configurable logic cells are thus defined by the configuration bits. This means that the corresponding look up table 25, 26 converts a desired Boolean operation which transfers the respective input data PD0, PD1 into output signals LTO0, LTO1 of the look up tables. In the normal operation, then following, of the FPGA chip 28, these output signals LTO0, LTO1, in turn, are conducted to the data inputs of the output flip flops 1, 2 for temporary storage.

Figure 7:
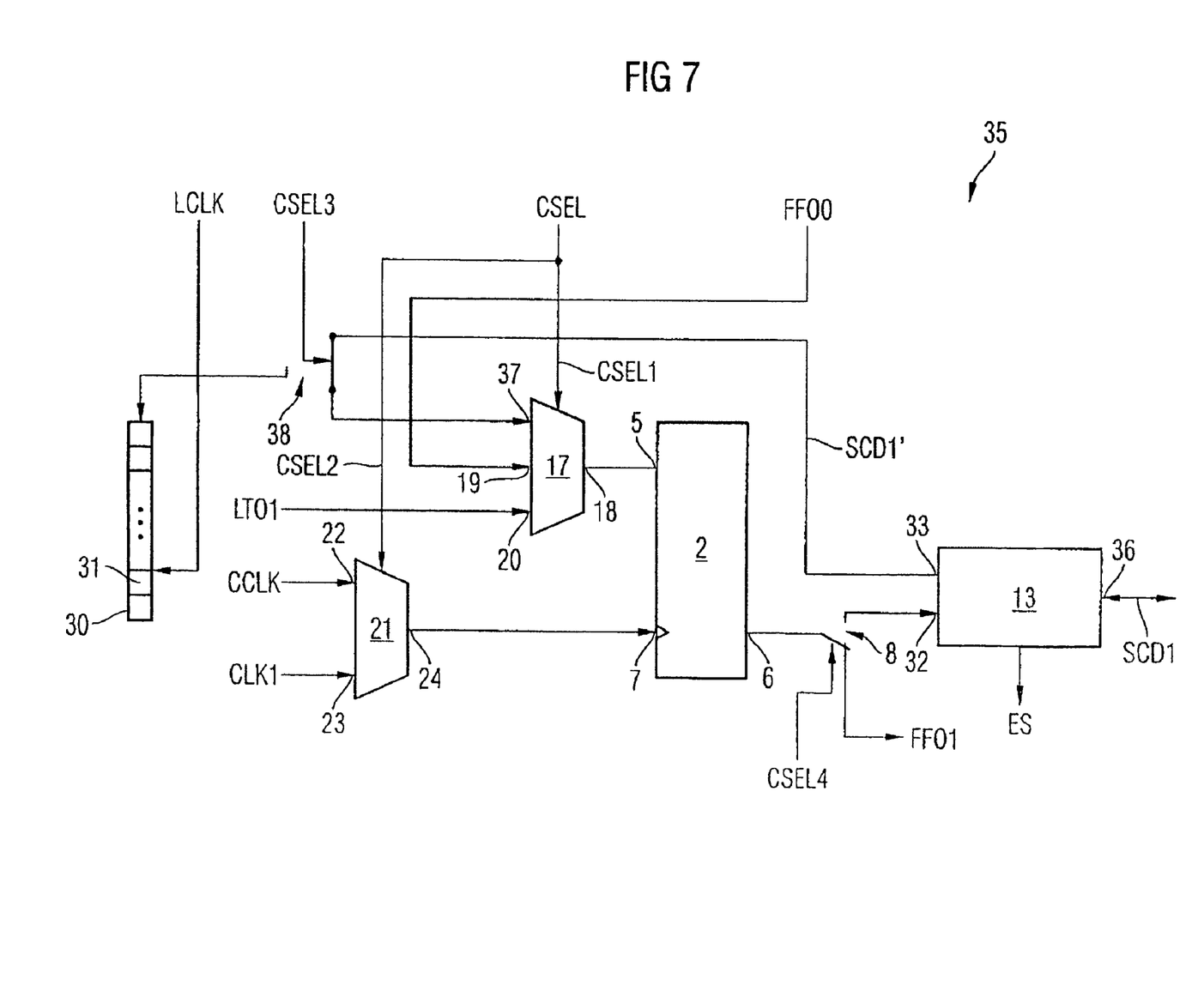
FIG. 7 is a block diagram of a third embodiment of an inventive circuit arrangement.

FIG. 7 shows a development of the circuit arrangement 35 according to the invention. The extended circuit arrangement 35 also enables a verification mode to be performed in order to check the correct writing of the configuration bits into the nonvolatile memory cells.

The developed circuit arrangement 35 essentially has the same elements as the circuit arrangement 16 shown in FIG. 4. It shows an output flip flop 2 with a data input 5, a data output 6 and a clock input 7. The clock input 7 is preceded by a multiplexer 21 which switches through a read clock signal CCLK or logic cell clock signal CLK1 in dependence on a selection signal CSEL2.

The output signal FF01 of the output flip flop 2 is conducted at a data output 6 and via a controllable switch 8 to the read input 32 of the read-in/-out amplifier 13. The switch 8 can be controlled via a further selection signal CSEL4. As already shown in FIGS. 3 and 5, the read-in/-out amplifier 13 is coupled to a respective bit line which, in turn, is connected to nonvolatile memory cells.

The data input 5 of this output flip flop 2 is also preceded by a multiplexer 17 which has three inputs 19, 20, 37 to which the output signal LTO1 of the respective look up table, an output signal FFO0 of another output flip flop (not shown here) or a read signal SCD1' is supplied, wherein the read signal SCD1' can be picked up at the read-out output 33 of the read-in/-out amplifier 13 and is switchably supplied to the respective input 37 of the multiplexer 17 via a further controllable switch 38. The further controllable switch 38 is controlled via a further selection signal CSEL3. The multiplexer 17 is controlled via a first selection signal CSL1.

The read signal SCD1' can be supplied either to the multiplexer 17 or to the configuration shift register 30 by means of the controllable switch 38. The configuration shift register 30 has shift register cells 31 and can be clocked by means of a configuration clock signal LCLK. In the configuration mode described with respect to FIG. 6, the read signals SCD1' are conducted from the memory cell array via the switch 38 into the configuration shift register 30.

In the read-in mode previously described, in which the configuration bits are read into the memory cell array (not shown here), the signal FFFO0, which is an output signal of a further output flip flop, is conducted via the first multiplexer 17 to the data input 5 and is serially conducted through the flip flop 2 so that the output signal FFO1 supplied to further flip flops of the corresponding column. Once the shift register is filled as has previously been described, the switch 8 is switched over so that the corresponding bit value which is stored in the output flip flop 2 can be written into a nonvolatile memory cell by means of the read-in/-out amplifier 13.

The development 35 then enables the configuration bits written into a nonvolatile memory cell to be verified. Once a configuration bit stored in the output flip flop 2 has been written into a corresponding nonvolatile memory cell via the read-in/-out amplifier 13, the corresponding read-in/-out amplifier 13 can compare the signal present at its read-in input 32, that is to say the logic level of the configuration bit written in, since this is still present stored in the output flip flop as before, with the signal present at its output 36 via a suitable comparison circuit. The signal present at its output 36 then corresponds to the logic level of a byte which is present in a nonvolatile memory cell addressed (by the word line decoder not shown here). If the writing-in process previously was error-free, the two logic levels at the read-in input 32 and the output 36 will correspond to one another. If this is not the case, an error has occurred during the writing into the nonvolatile memory cell which can be signaled by the read-in/-out amplifier 13. For example, a corresponding error signal ES can be output.

By means of the circuit arrangement 35 according to the invention, it is also possible to perform a further verification of the operation of the configurable logic cells. For this purpose, the output flip flops 2, after the configuration phase has been performed, that is to say the configuration shift registers are filled with corresponding configuration bits, are again switched as shift register chain and filled with expected reference output data which are written in a column of memory cells of the memory cell array 9. These reference output data are expected as output signals of the corresponding look up tables LTO1 when test input data are applied to the configurable logic cells.

In a further phase of this verification mode for the operability of the configurable logic cells, the output flip flops 2 are then operated as conventional output flip flops for the configurable logic cells. The test data are performed in accordance with the configurable logic cells which thereupon supply an output signal LTO1 of the respective look up table into the respective flip flop. A correspondingly prepared read-in/-out amplifier 13 then compares the result of the configured logic operations which is present in the read-out flip flop 2, with the correspondingly expected reference data item which is stored in a nonvolatile memory cell of the memory cell array. If the two data items agree, the corresponding FPGA chip or the configured logic cells are operating correctly.

Figure 8:
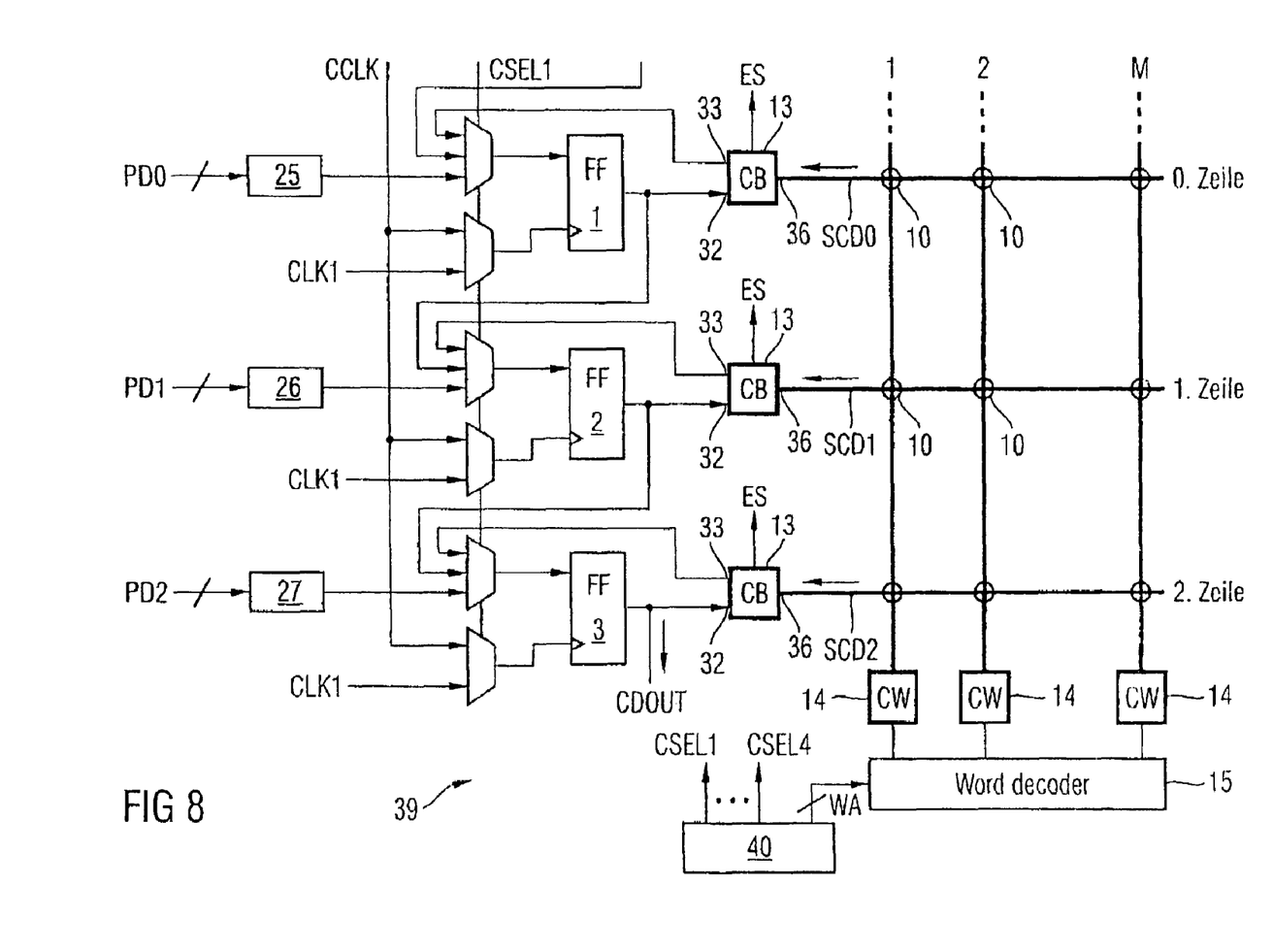
FIG. 8 is a diagrammatic representation of an inventive FPGA.

FIG. 8 diagrammatically shows use of the developed circuit arrangement 28 according to the invention in an FPGA device 39. The interconnection essentially corresponds to that shown in FIGS. 3, 5 and 6. Furthermore, a control device 40 is shown which supplies the selection signals CSEL1-CSEL4 and controls the word line decoder 15 with word address signals WA and coordinates the read-in/-out amplifiers 13, 14.

Figure 9:
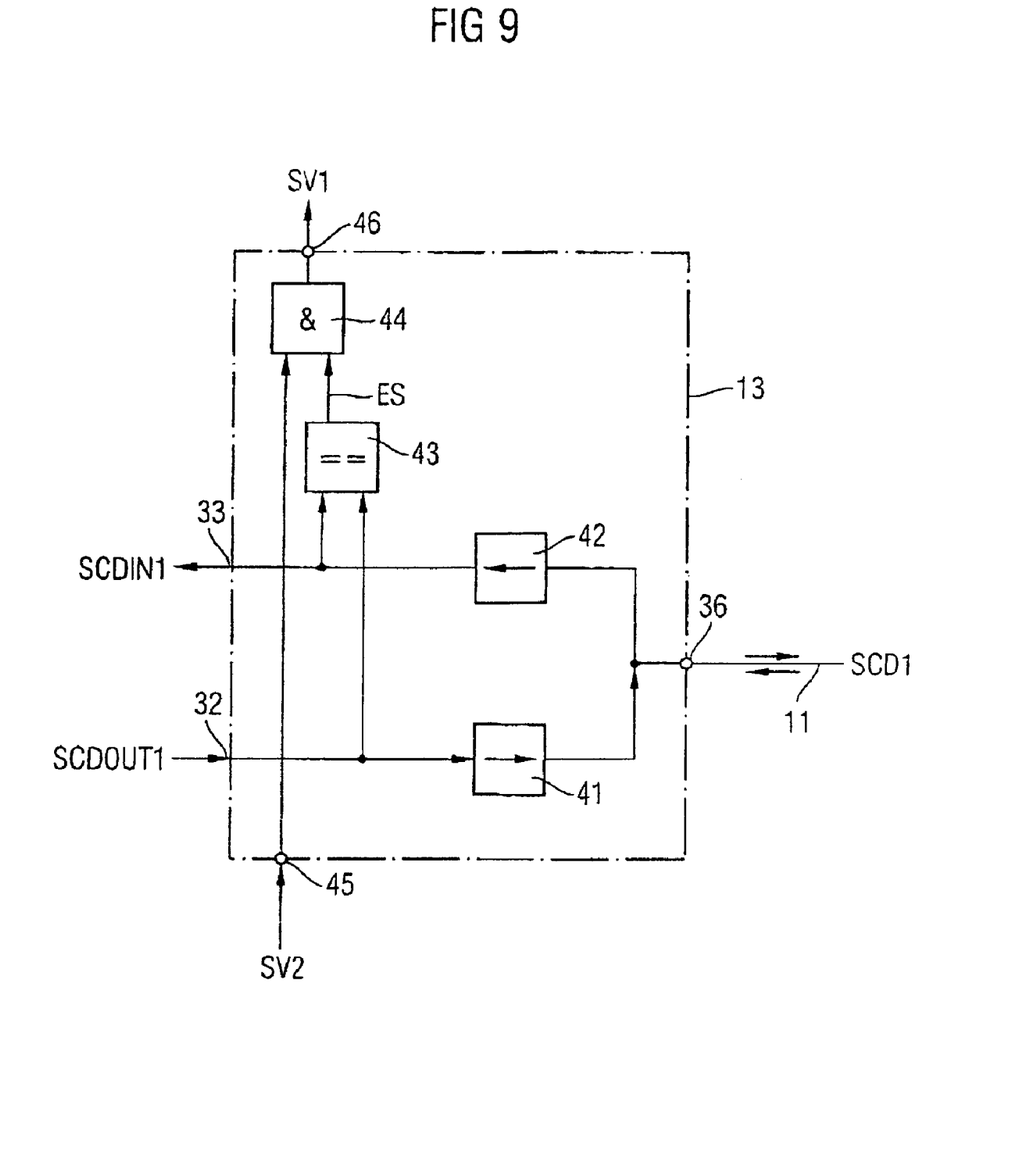
FIG. 9 is a read-in/-out amplifier according to the invention for a bit line.

FIG. 9 shows an exemplary embodiment of a read/write amplifier 13. The read/write amplifier 13 has a read-in input 32, a read-out output 33 and an output 36 for coupling to a corresponding bit line 11. Signals SCDOUT1, which are to be written into a memory cell coupled to the bit line 11, are brought into a suitable level form by a write converter 41 and applied to the bit line 11. A similar read converter 42 converts the signals SCD1 present at a bit line into corresponding logic levels required for the data processing and forwards them to the read-out output 33.

The read-in input 32 and the read-out output 33 is coupled to a comparison device 43 which generates a comparison result ES in dependence on the signals present at the input or output. As a result, it is possible, for example, to compare the content of a read-out flip flop coupled to the read-in input 32 with the memory cell content of a memory cell coupled to the bit line 11, which is amplified by the read converter 42, by means of the comparison device 43. This can be done, for example, for verifying the writing-in of the configuration data into the memory cells or, as already noted with respect to FIG. 7, for checking the operability of the configured logic cells.

The read-in/-out amplifier 13 shown here also has a logical AND gate 44 which is supplied with the comparison result ES and an error signal SV2 of a further read-in/-out amplifier (not shown here). The AND gate 44 supplies from this an error signal SV1 of the read-in/-out amplifier 13 considered here. The error signal of the further read-in/-out amplifier or of a read-in/-out amplifier associated with a directly adjacent bit line 11 is conducted to an error input 45 of the read-in/-out amplifier 13. The error signal SV1 of the read-in/-out amplifier 13 can be picked up at an error output 46.

The exemplary embodiment of the read-in/-out amplifier 13, shown here in FIG. 9, enables corresponding error signals SV2, SV1 to be formed and evaluated. As a result of this AND combination, it is possible, for example, to pick up a global error signal at the corresponding read-in/-out amplifier of row 0 (for example as shown in FIG. 8).

The present invention thus supplies a circuit arrangement which makes it possible to interconnect output flip flops, which are present in configurable logic cells, to form a shift register chain. As a result, configuration data can be written in a read-in mode via a shift register chain formed in this manner into a configuration memory from a memory cell array of nonvolatile memory cells. This is possible without further wiring expenditure which would otherwise be used.

Furthermore, the circuit arrangement according to the invention, in accordance with its exemplary embodiments, allows the configuration data stored in the nonvolatile memory cells to be read into corresponding configuration shift registers of the configurable logic cells in a configuration phase. In addition, the circuit according to the invention or, respectively, FPGA devices according to the invention provide for verification modes in which the correct writing-in of the configuration data into the configuration memory is checked. This is achieved by, among other things, the construction of the read-in/-out amplifiers according to the invention and the interconnection of the multiplexers provided.

In a further verification mode, it is also possible to check the correct operation of the configurable logic cells by reading reference data into the memory cell array. According to the invention, the reading-in can also take place due to the formation of a shift register by the output flip flops. Test input data are then conducted to the configurable logic cells and the corresponding logic output data are compared with the reference data in the memory cell array by the read-in/-out amplifiers.

The present invention is particularly suitable for application in FPGA chips in which the configurable logic cells are already constructed in a column-shaped arrangement. It is then particularly simple to interconnect the provided read-out flip flops to form a shift register. The present invention also makes it possible to use read-in/-out amplifiers provided in the configuration memory for the verification modes described. The transportation of the configuration data by the shift register formed from the output flip flops also enables configuration data to be written or changed only partially in the nonvolatile memory cells. With the matrix-shaped arrangement of the nonvolatile memory cells, a simple extension by means of word lines beyond the number of configuration bits needed for a respective configurable logic cell is easily possible in order to store a number of configuration data records. In addition, it is possible in a simple manner to disconnect parts of the circuit arrangements according to the invention during the different operating modes or to reduce the supply voltage. This reduces the current consumption of a corresponding FPGA.

What is claimed is:

1. A circuit arrangement comprising:
    a plurality of output flip flops configured to provide configuration data to configurable logic cells of a FPGA device, each output flip flop comprising at least one data input and one data output;
    wherein a data input of a first output flip flop of the plurality of output flip flops is switchably connected to a data output of a second output flip flop of the plurality of output flip flops for forming a shift register using at least a switching device integrated in the FPGA device;
    wherein at least one of the output flip flops comprises a clock input to which a read-in clock signal or a logic cell clock signal is supplied switchably; and
    wherein a multiplexer for switching the read-in clock signal or the respective logic cell clock signal precedes the clock input of a respective output flip flop, the multiplexer being controllable by means of a selection signal.

2. The circuit arrangement of claim 1, wherein the data output of a respective output flip flop is followed by a device for signal level conversion.

3. The circuit arrangement of claim 1, wherein the FPGA device comprises an integrated, nonvolatile memory for storing configuration bits.

4. The circuit arrangement of claim 1, wherein an output signal of a look up table of the respective logic cell is supplied to the data input of a respective output flip flop.

5. The circuit arrangement of claim 4, wherein the multiplexer is a second multiplexer and the selection signal is a second selection signal, and wherein the data input of a respective first output flip flop is preceded by a first multiplexer for switching the output signal of the respective look up table or the output signal of the second output flip flop; the first multiplexer being controllable by means of a first selection signal.

6. The circuit arrangement of claim 5, wherein each of the read-in/-out amplifiers comprises a read-in input for reading data into the memory cells coupled to the respective bit line and wherein each of the read-in/-out amplifiers comprises a read-out output for outputting configuration data to the respective configurable logic cell, wherein the data output of a respective output flip flop is connected to a read-in/-out amplifier for a bit line of a memory cell array, and wherein the respective first multiplexer comprises a third input to which the respective read-out output of the read-in/-out amplifier is connected, for switching configuration bits of the configuration data to the data input of the respective output flip flop.

7. The circuit arrangement of claim 6, wherein a respective read-out output of the read-in/-out amplifier is switchably connected to a configuration shift register of the respective configurable logic cell for transmitting the configuration bits.

8. The circuit arrangement of claim 4, wherein the multiplexer is a second multiplexer and the selection signal is a second selection signal, and wherein the data input of a respective first output flip flop is preceded by a first multiplexer for switching the output signal of the respective look up table or the output signal of the second output flip flop, wherein at least one of the output flip flops comprises a clock input to which a read-in clock signal or a logic cell clock signal is supplied switchably; the first multiplexer being controllable by means of a first selection signal, the second selection signal being identical to the first selection signal.

9. An FPGA device, comprising:
 a plurality of configurable logic cells;
 a plurality of circuit arrangements according to claim 8; and
 a nonvolatile memory cell array; the configurable logic cells being arranged in columns and a shift register can be formed by means of the output flip flops of the respective columns.

10. The FPGA device of claim 9, wherein the comparison results of the read-in/-out amplifiers of a column are logically combined with one another for generating a column error signal.

11. The FPGA device of claim 9, comprising a control device for generating the selection signals.

12. The FPGA device of claim 9, wherein a supply voltage for the first or second multiplexer can be separately disconnected.

13. The FPGA device of claim 9, wherein each memory cell coupled to a respective bit line is coupled to a switching transistor of the respective configurable logic cell; the switching transistors defining a logic function of the configurable logic cell.

14. The circuit arrangement of claim 1, wherein the output flip flops are constructed as clock-edge-controlled D-type flip flops.

15. The circuit arrangement of claim 1, wherein the data output of a respective output flip flop is connected to a read-in/-out amplifier for a bit line of a memory cell array.

16. The circuit arrangement of claim 15, wherein the read-in/-out amplifier comprises a signal level converter.

17. The circuit arrangement of claim 15, wherein the respective bit line is coupled to a predetermined number M of memory cells for storing configuration bits; the memory cells being arranged at points of intersection of corresponding word lines with the bit lines.

18. The circuit arrangement of claim 17, wherein the number of word lines corresponds to the number M of configuration bits for a configurable logic cell.

19. The circuit arrangement of claim 15, wherein each of the read-in/-out amplifiers comprises a read-in input for reading data into the memory cells coupled to the respective bit line and wherein each of the read-in/-out amplifiers comprises a read-out output for outputting configuration data to the respective configurable logic cell.

20. The circuit arrangement of claim 19, wherein a respective read-out output of the read-in/-out amplifier is switchably connected to a configuration shift register of the respective configurable logic cell for transmitting the configuration bits.

21. The circuit arrangement of claim 19, wherein a respective read-in/-out amplifier comprises a logic device for comparing a data item present at the read-in input and the read-out output and for outputting a comparison result.

22. A circuit arrangement comprising:
 a plurality of output flip flops configured to provide configuration data to configurable logic cells of a FPGA device, each output flip flop comprising at least one data input and one data output;
 wherein a data input of a first output flip flop of the plurality of output flip flops is switchably connected to a data output of a second output flip flop of the plurality of output flip flops for forming a shift register using at least a switching device integrated in the FPGA device;
 wherein at least one of the output flip flops comprises a clock input to which a read-in clock signal or a logic cell clock signal is supplied switchably;
 wherein the data output of a respective output flip flop is connected to a read-in/-out amplifier for a bit line of a memory cell array; and
 wherein the respective bit line is coupled to a predetermined number M of memory cells for storing configuration bits, the memory cells being arranged at points of intersection of corresponding word lines with the bit lines.

23. A circuit arrangement comprising:
 a plurality of output flip flops configured to provide configuration data to configurable logic cells of a FPGA device, each output flip flop comprising at least one data input and one data output;
 wherein a data input of a first output flip flop of the plurality of output flip flops is switchably connected to a data output of a second output flip flop of the plurality of output flip flops for forming a shift register using at least a switching device integrated in the FPGA device;
 wherein at least one of the output flip flops comprises a clock input to which a read-in clock signal or a logic cell clock signal is supplied switchably;
 wherein the data output of a respective output flip flop is connected to a read-in/-out amplifier for a bit line of a memory cell array; and
 wherein each of the read-in/-out amplifiers comprises a read-in input for reading data into the memory cells coupled to the respective bit line and wherein each of the read-in/-out amplifiers comprises a read-out output for outputting configuration data to the respective configurable logic cell.

* * * * *